United States Patent [19]

Ball

[11] Patent Number: 4,835,208
[45] Date of Patent: May 30, 1989

[54] METHOD FOR APPLYING A COMPOSITION TO A SUBSTRATE AND A COMPOSITION FOR USE THEREIN

[75] Inventor: Jeffrey M. Ball, West Didsbury, England

[73] Assignee: Willett International Limited, High Wycombe, England

[21] Appl. No.: 68,960

[22] Filed: Jul. 1, 1987

[51] Int. Cl.⁴ .................. C09D 11/12; C03C 17/00; C08L 52/00
[52] U.S. Cl. .................. 524/478; 524/488; 524/499; 106/31
[58] Field of Search .................. 106/22, 31, 272; 524/487–489, 499, 570, 478; 523/160; 428/913

[56] References Cited

U.S. PATENT DOCUMENTS

| | | | |
|---|---|---|---|
| 3,653,932 | 4/1972 | Berry et al. | 106/22 |
| 3,715,219 | 2/1973 | Kurz | 106/22 |
| 3,717,722 | 2/1973 | Messner | 118/630 |
| 4,066,585 | 1/1978 | Schepp | 106/27 |
| 4,361,843 | 11/1982 | Cooke et al. | 106/22 |
| 4,390,369 | 6/1983 | Merritt | 106/31 |
| 4,490,731 | 12/1984 | Vaught | 106/22 |
| 4,631,557 | 12/1986 | Cooke et al. | 106/20 |
| 4,659,383 | 4/1987 | Lin | 523/160 |
| 4,684,956 | 8/1987 | Ball | 106/22 |

FOREIGN PATENT DOCUMENTS 0097823 11/1984 European Pat. Off. .
55-368 4/1980 Japan .

*Primary Examiner*—Theodore Morris
*Attorney, Agent, or Firm*—Charles D. Gunter, Jr.

[57] ABSTRACT

The present invention provides a process for applying a thermoplastic composition as a series of discrete droplets from a non-contact ink jet printing apparatus to form separate drops on a substrate moving relative to the apparatus, characterized in that the molten composition is thermally stable at the temperature of application and is applied at a temperature in excess of 100° C.

The invention can be used to apply the molten composition to a variety of substrates using on-demand or continuous non-contact ink jet application techniques. However, the invention is of especial use in the application of thermoplastic inks to non-porous substrates using an on-demand ink jet printer.

2 Claims, No Drawings

METHOD FOR APPLYING A COMPOSITION TO A SUBSTRATE AND A COMPOSITION FOR USE THEREIN

The present invention relates to a method for applying a composition to a substrate and to a composition for use therein, notably to a method for applying thermoplastic inks and to a novel thermoplastic ink composition.

It has been proposed to apply inks through an ink jet printing machine where the inks are in the form of wax based compositions which are applied molten through the nozzle of the printer. In order to reduce problems which would be expected in attempting to operate at elevated temperatures (for example degradation of the composition), the prior proposals have required the use of comparatively low melting point compositions and low temperatures of operation. Thus, for example, in U.S. Pat. No. 3,653,932 the composition is required to have a melting point which does not exceed 51° C. and contains a didodecyl sebacate which is a highly viscous material. In order to overcome the problems associated with that formulation, U.S. Pat. No. 4,390,369 proposes the use of a composition which comprises a natural wax and has a melting point below about 75° C. The use of natural waxes is also proposed in European Application No. 097823, where the composition comprises a mixture of paraffin wax and stearic acid. However, such compositions do not adhere satisfactorily to plastics substrates, suffer from smudging, and problems are encountered due to the high viscosity of the compositions where synthetic materials are used.

Contrary to the teaching of the prior proposals, we have found that it is advantageous to operate a hot melt ink jet printer at a temperature in excess of 100° C. At such elevated temperatures, the waxes of the earlier proposals would often decompose whereas in the present invention they result in an image of improved definition, which resists smudging and has improved adhesion to plastics substrates, and also reduces the problems associated with the use of high viscosity materials.

U.S. Pat. No. 3,369,253 discloses a number of compositions for use in a pen type chart recorder in which ink flows continuously from a nozzle onto a moving substrate to draw lines thereon. There is direct contact between the nozzle and the substrate via the ink composition and the composition must have a sufficiently high surface tension at the temperature of operation to be pulled from the nozzle as a continuous stream and not as a series of individual droplets. Such requirements are totally the reverse of what is required in an ink jet printer where there is no direct contact between the printer and the substrate and the ink issues as a series of discrete droplets. Furthermore, in the U.S. Patent the substrate has to be of a specified type with a mandatory surface layer in order that the molten composition should be not cause appreciable dimensional changes in the substrate. The need for a special surface on the substrate severely limits the possible fields of use of this technique.

Accordingly, the present invention provides a process for applying a thermoplastic composition through a non-contact ink jet printing apparatus as a series of discrete droplets onto a substrate moving relative to the apparatus, characterised in that the molten composition is thermally stable at the temperature of application and is applied at a temperature in excess of 100° C.

The invention can be used to apply the molten composition to a variety of substrates using on-demand or continuous non-contact ink jet application techniques. However, the invention is of especial use in the application of thermoplastic ink compositions to a non-porous substrate, notably a plastics material, using an on-demand ink jet printer.

In an on-demand ink jet printer, ink is fed under pressure, typically 0.5 to 20 psi gauge, though higher pressures may be used if desired, from a reservoir to a series of nozzles via valve means which control the flow of the ink through each nozzle. The valve means is typically an electro-magnetically actuated valve, notably a solenoid valve. The ink is discharged through the nozzles as discrete droplets in the desired sequence to form the required image on the substrate. Usually, the nozzles are arranged in one or more series transversely to the line of movement of the substrate. Typically, such printers have quick acting valves with an operating cycle time of from 1 to 5 milliseconds feeding nozzles with orifices having bore diameters of from 0.01 to 0.45 mms and having an internal bore length to diameter ratio of from 3:1 to 1:2, notably from 2:1 to 1:1.

The thermoplastic compositions for present use comprise one or more image forming components, preferably oil miscible or soluble, in a fusible carrier medium. The image forming material can be one which forms a visual image on the substrate, e.g. it can be a dyestuff; or one which is detected by other means, e.g. it can be a magnetic material to be scanned by a suitable reader, or a fluorescent material, e.g. one which is detected by an ultra-violet or other radiation scanner. For convenience, the present invention will be described in terms of a composition containing a visually detectable dyestuff.

The composition for present use is preferably a solution or emulsion of the dyestuff in the carrier medium, i.e. it is substantially free from particles which might block the nozzles through which the composition is to be discharged. If necessary, the composition can contain a co-solvent or a briding fluid to aid formation of a substantially homogeneous composition.

The compositions comprise a fusible carrier medium which is rendered molten at the temperatures encountered in the method of the invention. The fusible carrier media for present use are thermally stable at the temperature of application and satisfy the surface tension and viscosity requirements of the ink jet printer they are to be applied through. In general, the carrier should not be thermally degraded or decomposed at temperatures of up to 160° C. and should have a viscosity of less than 120 Cps at the temperature of application. They should have a surface tension which is sufficiently low at the operating temperature for the ink to form discrete droplets rather than a continuous jet which forms a bridge bewteen the nozzle and the substrate. In view of the difficulties in measuring surface tensions at elevated temperatures, the most convenient test of suitability for present use is to run the composition through the ink jet printer in which it is to be used to ascertain whether it forms a continuous jet or discrete droplets at the operating temperature. In many cases measurement of surface tension at 25° C. will give a prima facie indication as to the suitability or otherwise of a composition for present use. The surface tension is determined by establishing whether a sample of the composition is wet or not by a series of fluids of known surface tension. Where the solid composition is wet, it has a higher surface tension than the fluid, where the fluid forms a stable droplet on the surface of the composition the composition has a lower surface tension. In general, where the composition has a surface tension of 50 dynes per cm or less in the above test, it will be suitable for present use.

The carrier media for present use can be selected from amongst natural waxes having the desired properties, but we prefer to use synthetic materials. We have found that microcrystalline waxes, notably the synthetic forms of such waxes, and/or hydrocarbon resins provide particularly advantageous carrier media, in that they can provide highly mobile molten compositions with reduced risk of degradation at high operating temperatures, which will typically be at from 110° to 160° C., notably at from 125° to 150° C. Moreover, where the composition has a softening point greater than 60° C., the rapid cooling of the droplets of the composition as they strike the substrate and the partial fusing of the substrate below the hot droplet in the case of plastics substrates gives an image which resists smudging.

The invention therefore also provides a fusible ink composition comprising one or more oil soluble or miscible indicator materials, notably a dyestuff, in a carrier medium comprising a synthetic microcrystalline wax and/or a hydrocarbon resin, the composition having a viscosity of less than 120 Cps, a surface tension (as determined by the test method descibed above) of less than 50 dynes per cm at 25° C. and a softening point of from 60° to 110° C.

The microcrystalline waxes for present use can be selected from a wide range of such waxes which are available commercially. Typically, the wax will be a synthetic hydrocarbon wax obtained from the processing of petroleum or naphtas, notably the naphthenic, polyethylene or polypropylene waxes which have softening points in the range 60° to 110° C., notably 70° to 90° C. Other suitable waxes include those obtained by the Fischer Tropsch process, typically those comprising long chain linear paraffins with molecular weights of from 300 to 1500 and softening points in the range 80° to 110° C. Preferred synthetic microcrystalline waxes for present use include Slack Wax and the polyethylene waxes obtained from the lighter fractions of the cracking of naphtha and petroleum. If desired, the microcrystalline wax may be used in the form of a derivative thereof, e.g. as an oxidised or maleinised derivative.

The hydrocarbon resins for present use are preferably crystalline resins, notably $C_5$ to $C_9$ chain length aliphatic waxes or polyolefins with softening points greater than 90° C., typically 90° to 110° C., and melting points greater than 110° C., preferably in the range 140° to 160° C. Typically, the polyethylene resins will have a mean molecular weight of less than 1500, e.g. 500 to 1200 and an acid number of less than 1 (expressed as mg KOH/g). Suitable hydrocarbon resins for present use thus include polyolefins, notably polyethylene, polypropylene or polybutylene; $C_5$ to $C_9$ chain aliphatic resins, e.g. those obtained by the steam cracking of naphthas; polyterpenes, notably wood rosins, tall oil or balsam resins, which can be esterified or hydrogenated if desired; and aromatic compounds, e.g. styrenes such as methyl styrenes.

Whilst the hydrocarbon resin may often be a microcrystalline material, we have found that the use of a mixture of both an hydrocarbon resin and a synthetic microcrystalline wax as described above is of especial advantage, since the hydrocarbon resin enhances the adhesion of the wax based composition to non-porous substrates, notably to plastics sheet substrates. Furthermore, by varying the proportions of the resin and wax it is possible to tailor make the properties of the composition, e.g. the viscosity, to suit a wide range of operating conditions.

The compositions of the invention may contain other ingredients in addition to the microcrystalline wax, resin and image forming material. Thus, the compositions can contain thermal and/or UV stabilising materials to reduce the degradation of the ingredients of the composition; and minor proportions of one or more solvents or co-solvents for the ingredients to aid formulation of the composition as a substantially homogeneous mixture.

The compositions for present use preferably have a viscosity of less than 120, preferably 2 to 120, notably 3 to 20, Cps at the temperature of operation of the printer, typically 120° to 160° C.; and a surface tension of less than 40 dynes per cm, preferably less than 30 dynes per cm, at 25° C. using the test method described above.

It may be desired to include one or more viscosity and/or surface tension modifying agents in the composition to achieve the desired viscosity and/or surface tension at the actual operating temperatures for optimum operation of a particular printer. However, as indicated above, we have found that the viscosity and the surface tension are affected by the relative proportions of the microcrystalline wax and the hydrocarbon resin in the composition and that the viscosity and surface tension can often be adjusted to the desired values merely by varying the relative proportions of these two ingredients.

Where the compositions are to be applied using a continuous jet ink printer, it is necessary that the composition be one which can accept an electrical charge. This is conveniently achieved by including one or more ionic or polar materials in the composition, e.g. potassium isothiocyanate. In order to reduce the risk of segregation of these materials from the composition, it may be desired to incorporate a bridging compound, e.g. a wetting agent of the alkyl ether sulphate or sulphonate or of the alkyl benzene sulphonate type, into the composition. Typically, the composition for application through a continuous jet printer will have a conductivity of at least 1000, preferably 1500 to 2500, microSiemens.

The compositions of the invention comprise the microcrystalline wax, the hydrocarbon resin and the image forming material in any suitable proportion having regard to the nature of the ingredients, the nature of the substrate it is to be applied to and the operating conditions under which it is applied. Typically, the composition comprises at least one selected from a microcrystalline wax or an hydrocarbon resin, the microcrystalline wax being present in up to 99.9%, notably from 40 to 99.5%; the hydrocarbon resin being present in from 0 to 65%, notably 25 to 55%; and the image forming material being present in from 0.05 to 5%, preferably 0.1 to 2%: all percentages being of the active material and by weight on the weight of the total composition.

A particularly preferred composition for present use comprises from 40 to 99 parts by weight of a microcrystalline polyethylene wax, from 0 to 60 parts by weight of a polyethylene or styrene hydrocarbon resin of molecular weight from 500 to 1200, and 0.1 to 1.5 parts by weight of an oil soluble dyestuff.

The compositions of the invention can be made by any suitable technique, e.g. by melting the wax and/or resin components thereinto.

The compositions can be put up in the form of powders or granules by spraying the molten mixtures of the components into a void vessel. Alternatively, they can be extruded through a suitable die to form moulded plugs of the composition for insertion into a suitable shaped receptacle in the printer for melting and use.

As stated above, the compositions of the invention are applied to a substrate by passing them through the nozzle or array of nozzles of an ink jet printer apparatus at an elevated temperature. The apparatus can be of conventional design, except that those parts of the apparatus through which the molten composition is to flow are heated or insulated so as to reduce the risk of the composition solidifying within the apparatus. Such heating can be achieved by any suitable means, e.g. by electrical heating elements around the appropriate ducts or vessels or by infra red or other radiant heaters playing on the apparatus. Typically, the apparatus is operated with the composition flowing therethrough at temperatures of from 125° to 150° C., e.g. about 140° C.

The composition is fed to the apparatus in solid form, e.g., as chips or granules or the shaped plugs described above, and is melted in a suitable vessel attached to or forming an integral part of the printer apparatus. If desired, the compositions can be held in a separate heated reservoir and fed to one or more individual printers through heated or insulated lines.

Surprisingly, the presence of the microcrystalline wax or hydrocarbon resin, notably the combination thereof, does not have the deleterious effect of radically increasing the viscosity of the composition as is the case with the sebecate waxes proposed hitherto. The printing apparatus can therefore be operated under similar pressures and flow rates as with a conventional ink formulation and using nozzle orifices in the range 10 to 450 microns diameter.

The compositions of this invention can be applied to a wide range of porous and non-porous substrates, e.g. paper, metal, wood, plastics or glass without the need to form any special surface layer on the substrate. However, the invention is of especial use in forming images on non-porous materials, e.g. plastics, plastics coated materials, glass and metals. The high temperature of the composition as it is desposited on a plastics substrate causes enhanced adhesion of the composition due to partial fusion with the substrate. In the case of porous substrates the compositions penetrate into the substrate as they cool. In both cases, the compositions of the invention solidify rapidly on the substrate to give a sharp image resistant to smudging.

The invention has been described above in terms of the application of an ink-type composition. However, it can also be applied to adhesive composition, for example those containing polyacrylamide or similar polymers. Whilst it is known to apply hot melt adhesives from a gun or other applicator which extrudes the molten adhesive onto a substrate, we believe that it is novel to apply hot melt adhesives as droplets emitted from an ink jet printer where the droplets are emmited at a frequency of more than 100 drops per second from a nozzle.

The invention therefore also provides a method for applying a molten adhesive composition to a substrate characterised in that the adhesive composition is dispensed at a temperature in excess of 100° C. through a nozzle to form a series of droplets which are applied to the substrate, the droplets being formed at the nozzle at a rate of more than 100 per second.

The invention will now be illustrated by the following Examples in which all parts and percentages are given by weight:

EXAMPLE 1

An ink formulation was prepared by melting the microcrystalline polyethylene wax commercially available under the trade name Shell Microcrystalline wax MMP (54 parts) in a heated vessel fitted with a stirrer. To the molten was were added the oil soluble dyestuff Ceres Blue (1 part) and 45 parts of the hydrocarbon resin sold under the trade name Escorez 5300. The resultant mixture had a softening point of 85° C. and a melting point of 90° C., both as determined by Brookfield thermoset viscometer, and surface tension of less than 40 dynes per cm as determined by the test method described earlier.

The composition was fed to a drop-on-demand ink jet printer having electrical heating coils to maintain the ink reservoir, ink lines and printing head at 140° C.±5° C. The reservoir was pressurised to 2 psi gauge and the molten composition printed through the print head using a 0.225 mms bore orifice to produce a series of separate droplets which formed discrete dot images on a paper or polyethylene sheet target placed below the printing head. The dots were sharply defined, well anchored to the substrate and resistant to smudging.

By way of contrast, when natural carnuba wax was used in place of the microcrystalline wax and hydrocarbon resin, the composition had a melting point of 50° C. and began to degrade when held at 120° C. for 1 hour, as evidenced by charring. When this composition was applied to a paper substrate at 80° C., the image was brittle and readily broke up and did not adhere at all. Where a polyethylene sheet was used as the substrate, the image did not adhere to the sheet and was readily wiped off.

EXAMPLE 2

The process of Example 1 was repeated with a range of different resins and waxes being applied onto different target substrates including glass, metal, polyethylene, polypropylene, PVC, polystyrene, wax and plastics coated paper and card. The compositions are set out below as formulations A, B and C and in all cases the compositions were applied as in Example 1 and gave good dot images.

When the compositions were replaced by conventional sovent based formulations or low temperature wax formulations and applied to a non-porous substrate, the resultant dots either did not dry rapidly and gave a runny image (in the case of a solvent ink) or were soft and readily smudged (in the case of the low temperature waxes).

Formulation A
54.7% wood rosin ester hydrocarbon resin
45.0% low melting point microcrystalline polyethylene wax
0.3% oil soluble dyestuff Formulation B
70.0% medium melting point microcrystalline polyethylene wax
29.5% commercially available $C_5$–$C_9$ aliphatic hydrocarbon resin
0.5% oil soluble dyestuff Formulation C
55% commercially available water white grade alpha methyl styrene hydrocarbon resin
44.9% of a commercially available mixture of microcrystalline and paraffin waxes
0.1% oil soluble dyestuff.

I claim:

1. A thermoplastic composition suitable for application at an elevated temperature in the molten state to a substrate through the nozzle of a non-contact applicator which composition comprises at least one image forming component, selected from those soluble in and those miscible in an oil, carried in a fusible carrier medium which medium comprises a crystalline hydrocarbon resin, the thermoplastic composition being further characterized in that the hydrocarbon resin is selected from crystalline $C_5$ to $C_9$ chain length aliphatic resins and polyolefin resins with softening points greater than 90° C. and melting points greater than 110° C.

2. A thermplastic composition suitable for application at an elevated temperature in the molten state to a substrate through the nozzle of a non-contact applicator which composition comprises at least one image forming component, selected from those soluble in and those miscible in an oil, carried in a fusible carrier medium which medium comprises a synthetic microcrystalline wax and a crystalline hydrocarbon resin, the thermoplastic composition being further characterized in that the microcrystalline wax is present in from 40 to 74.5%; the hydrocarbon resin in from 25 to 55% and the image forming material in from 0.1 to 2%; all percentages being of the active material and by weight on the weight of the total composition.

* * * * *